US010009002B1

(12) United States Patent
Branch et al.

(10) Patent No.: US 10,009,002 B1
(45) Date of Patent: Jun. 26, 2018

(54) METHODS FOR SUPPRESSING SPURIOUS MODES IN MICRORESONATORS

(71) Applicant: Sandia Corporation, Albuquerque, NM (US)

(72) Inventors: Darren W. Branch, Albuquerque, NM (US); Roy H. Olsson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 5 days.

(21) Appl. No.: 15/239,662

(22) Filed: Aug. 17, 2016

Related U.S. Application Data

(60) Provisional application No. 62/214,689, filed on Sep. 4, 2015.

(51) Int. Cl.
| H03H 9/15 | (2006.01) |
| H03H 9/25 | (2006.01) |
| H03H 3/02 | (2006.01) |
| H03H 3/08 | (2006.01) |
| H03H 9/02 | (2006.01) |
| H03H 3/007 | (2006.01) |

(52) U.S. Cl.
CPC ........ *H03H 9/02228* (2013.01); *H03H 3/007* (2013.01); *H03H 3/02* (2013.01); *H03H 3/08* (2013.01); *H03H 9/02086* (2013.01); *H03H 9/02818* (2013.01); *H03H 2009/02503* (2013.01)

(58) Field of Classification Search
CPC ............ H03H 3/007; H03H 3/02; H03H 3/04; H03H 3/08; H03H 9/02086; H03H 9/02228; H03H 2009/02503; H03H 9/02818; H03H 2003/021; H03H 2003/027; H03H 2003/028; H03H 2003/0414; H03H 2003/0421; H03H 2003/0442
USPC .................................. 333/186, 187, 193, 194
See application file for complete search history.

(56) References Cited

U.S. PATENT DOCUMENTS

| 5,073,763 | A | 12/1991 | Wright |
| 6,777,855 | B2 | 8/2004 | Bergmann et al. |
| 7,173,360 | B2 | 2/2007 | Hartmann et al. |
| 7,291,310 | B2 | 11/2007 | Martin et al. |
| 7,385,334 | B1 | 6/2008 | Olsson et al. |
| 7,528,685 | B2 * | 5/2009 | Tanaka ............... H03H 9/02551 333/193 |
| 7,616,077 | B1 | 11/2009 | Wittwer et al. |
| 7,652,547 | B1 | 1/2010 | Wittwer et al. |

(Continued)

OTHER PUBLICATIONS

Yantchev et al.; "Suppresson of Transverse-mode Spurious Responses in Thin Flim Lamb Wave Resonators by Bandgap Engineering"; published in 2014 IEEE International Ultrasonics Symposium Proceedings, pp. 2552-2555, and 1 page IEEE Xplore abstract showing Date of Conference Sep. 3-6, 2014.*

(Continued)

*Primary Examiner* — Barbara Summons
(74) *Attorney, Agent, or Firm* — Helen S. Baca

(57) ABSTRACT

The present invention relates to methods for suppressing spurious modes in microresonators. In particular embodiments, such spurious modes can be reduced by providing one or more structural components that effectively reduce the acoustic velocity in the transducer domain. Additional methods and microresonators are described herein.

23 Claims, 8 Drawing Sheets

(56) References Cited

U.S. PATENT DOCUMENTS

| | | |
|---|---|---|
| 7,733,198 B1 | 6/2010 | Olsson et al. |
| 7,836,566 B1 | 11/2010 | Olsson et al. |
| 7,859,350 B1 | 12/2010 | Schwindt et al. |
| 7,878,063 B1 | 2/2011 | Cular et al. |
| 7,942,568 B1 | 5/2011 | Branch et al. |
| 8,094,023 B1 | 1/2012 | El-Kady et al. |
| 8,367,305 B1 | 2/2013 | Wojciechowski et al. |
| 8,425,749 B1 | 4/2013 | Ravula et al. |
| 8,436,509 B1 | 5/2013 | Branch et al. |
| 8,466,754 B1 | 6/2013 | Olen et al. |
| 8,497,747 B1 | 7/2013 | Wojciechowski et al. |
| 8,508,370 B1 | 8/2013 | El-Kady et al. |
| 8,525,619 B1 | 9/2013 | Olsson et al. |
| 8,597,985 B1 | 12/2013 | Chanchani et al. |
| 8,600,200 B1 | 12/2013 | Rakich et al. |
| 8,669,688 B1 | 3/2014 | Branch |
| 8,669,823 B1 | 3/2014 | Olsson et al. |
| 8,709,791 B2 | 4/2014 | Larson et al. |
| 9,083,303 B2* | 7/2015 | Matsuda ............ H03H 9/6483 |
| 9,096,823 B1 | 8/2015 | Branch et al. |
| 9,203,134 B1 | 12/2015 | Henry et al. |
| 9,270,281 B1 | 2/2016 | Wojciechowski et al. |
| 9,276,557 B1 | 3/2016 | Nordquist et al. |
| 9,337,800 B1 | 5/2016 | Olsson, III et al. |
| 9,484,216 B1 | 11/2016 | Bauer et al. |
| 9,512,421 B1 | 12/2016 | Branch et al. |
| 9,525,398 B1 | 12/2016 | Olsson et al. |
| 9,549,704 B1 | 1/2017 | Buerger et al. |
| 9,641,154 B2 | 5/2017 | Olsson et al. |
| 9,646,874 B1 | 5/2017 | Wojciechowski et al. |
| 9,824,932 B1 | 11/2017 | Wojciechowski et al. |
| 9,865,987 B1 | 1/2018 | Eichenfield et al. |
| 2012/0313483 A1* | 12/2012 | Matsuda ............ H03H 9/02866 310/313 C |
| 2013/0342286 A1* | 12/2013 | Abbott ................ H03H 9/0222 333/193 |
| 2017/0052174 A1 | 2/2017 | Branch et al. |
| 2017/0216840 A1 | 8/2017 | Branch et al. |

OTHER PUBLICATIONS

Branch et al.; "Suppressing Fine-Frequency Modes in Aluminum Nitride Microresonators"; published in 2014 IEEE International Ultrasonics Symposium Proceedings, pp. 572-577, and 1 page IEEE Xplore abstract showing Date of Conference Sep. 3-6, 2014.*

Zhang et al.; "Transverse Mode Spurious Resonance Suppression in Lamb Wave MEMS Resonators: Theory, Modeling, and Experiment"; published in IEEE Transactions on Electron Devices, vol. 62, No. 9, Sep. 2015, pp. 3034-3041, and 1 page IEEE Xplore abstract showing Date of Publication Aug. 4, 2015.*

U.S. Appl. No. 14/691,441, filed Apr. 20, 2015, Olsson et al.
U.S. Appl. No. 15/072,611, filed Mar. 17, 2016, Olsson et al.
U.S. Appl. No. 15/265,340, filed Sep. 14, 2016, Henry et al.
U.S. Appl. No. 15/718,817, filed Sep. 28, 2017, Friedmann et al.
U.S. Appl. No. 15/843,355, filed Dec. 15, 2017, Nordquist et al.

Branch DW et al., "Elucidating the origin of spurious modes in aluminum nitride microresonators using a 2-D finite-element model," *IEEE Trans. Ultrason. Ferroelectr. Frequency Control* 2014;61(5):729-38.

Branch DW et al., "Love wave acoustic array biosensor platform for autonomous detection," *IEEE Ultrasonics Symposium*, held on Oct. 28-31, 2007 in New York, NY (pp. 260-263).

Branch DW et al., "Shear horizontal surface acoustic wave microsensor for class A viral and bacterial detection," *Sandia Report No. SAND2008-6128*, Oct. 2008, Sandia National Laboratories (74 pp.).

Haus Ha, "Modes in SAW grating resonators," *J. Appl. Phys.* 1977;48:4955-61.

Haydl WH et al., "Multimode SAW resonators—A method to study the optimum resonator design," *IEEE Ultrasonics Symposium*, held on Sep. 29-Oct. 1, 1976 in Annapolis, MD (pp. 287-296).

Hirota K et al., "Analysis of SAW grating waveguides using 2D coupling-of-modes equations," *IEEE Ultrasonics Symposium*, held on Oct. 7-10, 2001 in Atlanta, GA (pp. 115-120).

Kim B et al., "AIN microresonator-based filters with multiple bandwidths at low intermediate frequencies," *J. Microelectromech. Sys.* Aug. 2013;22(4):949-61.

Kovacs G, "A generalised P-matrix model for Saw filters," *IEEE Symposium on Ultrasonics*, held on Oct. 5-8, 2003 in Honolulu, HI (vol. 1, pp. 707-710).

Nakamura H et al., "Suppression mechanism of transverse-mode spurious responses in SAW resonators on a $SiO_2/Al/LiNbO_3$ structure," *IEEE International Ultrasonics Symposium*, held on Oct. 18-21, 2011 in Orlando, FL (pp. 543-546).

Nakamura H et al., "Suppression of transverse-mode spurious responses for saw resonators on $SiO_2/Al/LiNbO_3$ structure by selective removal of $SiO_2$," IEEE Trans. Ultrason. Ferroelectr. Frequency Control 2011;58(10):2188-93.

Naumenko N, "Multilayered structure as a novel material for surface acoustic wave devices: physical insight," in *Acoustic Waves—From Microdevices to Helioseismology*, Marco G. Beghi (ed.), InTech, 2011 (chapter 19, 23 pp.).

Naumenko N, "Transformation of surface acoustic waves into boundary waves in piezoelectric/metal/dielectric structures," *IEEE International Ultrasonics Symposium*, held on Sep. 20-23, 2009 in Rome, Italy (pp. 2635-2638).

Olsson RH et al., "Origins and mitigation of spurious modes in aluminum nitride microresonators," *IEEE Ultrasonics Symposium*, held on Oct. 11-14, 2010 in San Diego, CA (pp. 1272-1276).

Olsson RH et al., "Post-CMOS compatible aluminum nitride MEMS filters and resonant sensors," *Joint IEEE International Frequency Control Symposium with the 21st European Frequency and Time Forum*, held on May 29-Jun. 1, 2007 in Geneva, Switzerland (pp. 412-419).

Piazza G et al., "Piezoelectric aluminum nitride thin films for microelectromechanical systems," *MRS Bull.* 2012;37(11):1051-61.

Piazza G et al., "Two-port stacked piezoelectric aluminum nitride contour-mode resonant MEMS," *Sens. Actuat. A* 2007;136(2):638-45, only pp. 638-639 provided.

Plessky V et al., "Coupling-of-modes analysis of SAW devices," *Int'l J. High Speed Electron. Sys.* 2000;10(4):867-948 (81 pp.).

Qiao D et al., "General Green's function for SAW device analysis," *IEEE Trans. Ultrason. Ferroelectr. Frequency Control* 1999;46(5):1242-53.

Ruppel CCW et al., "Review of models for low-loss filter design and applications," *IEEE Proc. Ultrasonics Symposium*, held on Oct. 31-Nov. 3, 1994 in Cannes, France (vol. 1, pp. 313-324).

Schmidt RV et al., "Thin-film acoustic surface waveguides on anisotropic media," *IEEE Trans. Sonics Ultrason.* 1975;22(2):115-22.

Tan EL, "A robust formulation of SAW Green's functions for arbitrarily thick multilayers at high frequencies," *IEEE Trans. Ultrason. Ferroelectr. Frequency Control* 2002;49(7):929-36.

Thalmayr F et al., "Fast evaluation of Lamb wave scattering by time harmonic FEM simulation," *IEEE International Ultrasonics Symposium*, held on Sep. 20-23, 2009 in Rome, Italy (pp. 2805-2809).

Tokuda O et al., "Two-dimensional coupling-of-modes analysis in surface acoustic wave device performed by COMSOL multiphysics," *Jpn. J. Appl. Phys.* 2011;50(7S):07HD15 (5 pp.).

Wagner K et al., "A 2D P-matrix model for the simulation of waveguiding and diffraction in SAW components," *IEEE Ultrasonics Symposium*, held on Oct. 2-6, 2006 in Vancouver, BC, Canada (pp. 380-388).

Yamamoto Y et al., "SAW transversely guided mode spurious elimination by optimization of conversion efficiency using W/WO electrode structure," *IEEE Ultrasonics Symposium*, held on Oct. 5-8, 1998 in Sendai, Japan (vol. 1, pp. 229-234).

* cited by examiner

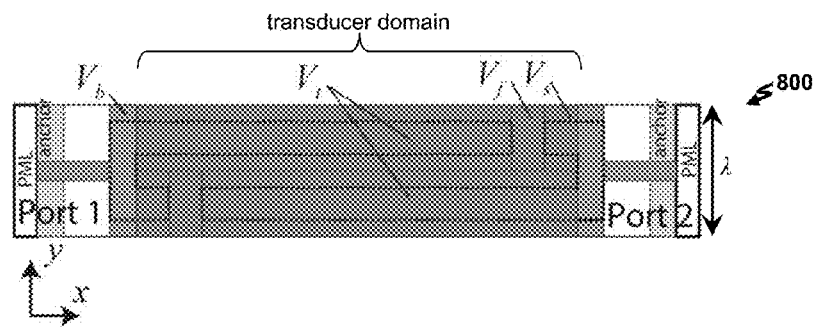
FIG. 8A
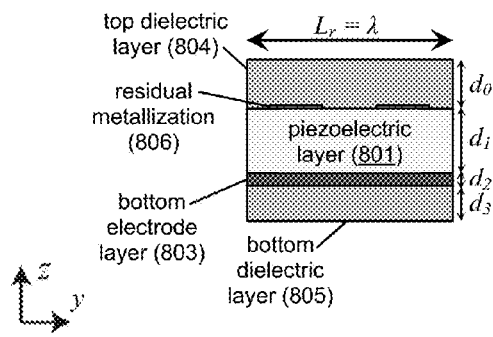
FIG. 8B
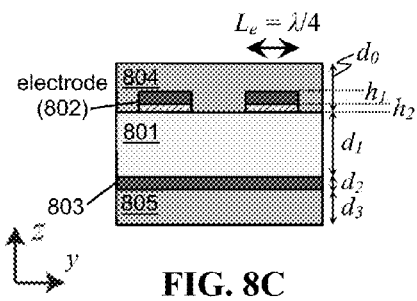 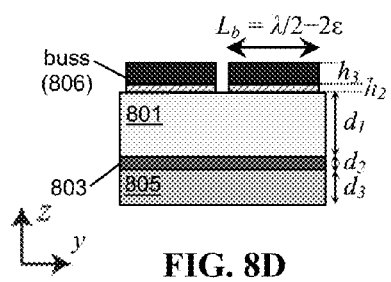
FIG. 8C  FIG. 8D

METHODS FOR SUPPRESSING SPURIOUS MODES IN MICRORESONATORS

CROSS-REFERENCE TO RELATED APPLICATION

This application claims priority to U.S. Provisional Patent Application No. 62/214,689, filed on Sep. 4, 2015 under the title, "METHODS FOR SUPPRESSING SPURIOUS MODES IN MICRORESONATORS," the entirety of which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to microresonators having suppressed spurious modes, as well as methods thereof. In particular embodiments, such spurious modes can be reduced by providing one or more structural components that effectively reduce the acoustic velocity in the transducer domain of the microresonator. Additional methods and microresonators are described herein.

BACKGROUND OF THE INVENTION

Microresonators are microfabricated resonating elements having numerous applications, including signal processing and sensing. For example, microresonators fabricated from aluminum nitride (AlN) are used in radiofrequency (RF) filters, accelerometers, and sensors. AlN is one example of a piezoelectric material that responds both electrically and mechanically to applied electric signals, and that can be formed into an electroacoustic resonator capable of modifying such signals.

For any MEMS-based filter, signal degradation can arise from undesired spurious responses. For instance, an AlN microresonator can efficiently transduce numerous symmetric and anti-symmetric Lamb modes, but spurious modes can arise from acoustic waves interacting with various device components. Accordingly, additional resonator architectures and methods are needed to reduce and mitigate such spurious responses.

SUMMARY OF THE INVENTION

The present invention relates to methods and microresonators having reduced fine-frequency spurious modes. In particular embodiments, the method includes determining the acoustic velocity in the transducer domain of the microresonator that reduces fine-frequency spurious modes, as well as that minimizes impedance mismatch. In one nonlimiting embodiment, the determined acoustic velocity is associated with a particular thickness of a dielectric layer that would provide that acoustic velocity, and that thickness of the dielectric layer is deposited on a top surface of the microresonator.

In particular embodiments, the microresonator includes an aluminum nitride (AlN) piezoelectric layer. Such AlN-based resonators and microresonators possess numerous benefits, such as small form factor, low cost batch-fabrication, compatibility with CMOS integrated circuits, and frequencies that are definable by lithography (not film thickness). This CAD-definable resonant frequency provides a flexible way to integrate multiple filters operating at different frequencies and bandwidths in a single chip, thus minimizing die-to-die variability and simplifying miniaturization.

Such AlN resonators and microresonators can include any useful stack, such as those having a top electrode layer (e.g., including patterned, periodic electrodes), an AlN layer, a bottom electrode layer (e.g., including a metal layer), and an optional temperature compensation layer (e.g., composed of an insulator or a dielectric, such as silicon dioxide). In some embodiments, the top electrode layer includes alternating input and output electrodes. To operate, an electrical field is applied between the input electrode and the bottom electrode, thereby inducing a strain in the AlN layer though the $d_{31}$ piezoelectric coefficient and laterally propagating a wave. As the wave propagates to the neighboring electrodes, the induced strain is piezoelectrically transduced into an electrical signal. The pitch p of the periodic electrodes (i.e., the distance between two of the periodic electrodes in the top layer) is half the acoustic wavelength at resonance. Thus, resonant frequency f can be determined by the ratio of the sound velocity v to two times the pitch p (i.e., f=v/2p). In this manner, as pitch can be defined lithographically, the resonant frequency can be defined simply by choosing the appropriate electrode pitch. Additional details for microresonators are described in Kim B et al., "AlN microresonator-based filters with multiple bandwidths at low intermediate frequencies," *J. Microelectromech. Sys.* 2013 August; 22(4): 949-61, as well as U.S. Pat. Nos. 7,385,334, 8,367,305, and 8,669,823, each which is incorporated herein by reference in its entirety.

Definitions

As used herein, the term "about" means +/−10% of any recited value. As used herein, this term modifies any recited value, range of values, or endpoints of one or more ranges.

By "spurious mode" is meant a mode that is not predicted by an electrical equivalent circuit of the resonator. Such modes can include transmission (S21) parameters.

By "micro" is meant having at least one dimension that is less than 1 mm. For instance, a microstructure (e.g., any microresonator structure described herein) can have a length, width, height, cross-sectional dimension, circumference, radius (e.g., external or internal radius), or diameter that is less than 1 mm.

By "nano" is meant having at least one dimension that is less than 1 μm. For instance, a nanostructure (e.g., any structure described herein) can have a length, width, height, cross-sectional dimension, circumference, radius (e.g., external or internal radius), or diameter that is less than 1 μm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

FIG. 8A-8D shows schematics of different domains for the microresonator model. Provided are (A) a plan view of the model 800, in which a dielectric layer can be deposited in the transducer domain (dark gray); (B) a cross-sectional view of the free space domain; (C) a cross-sectional view of the transducer domain and the stub domain; and (D) a cross-sectional view of the buss domain.

DETAILED DESCRIPTION OF THE INVENTION

The present invention relates to microresonators having suppressed spurious responses, as well as methods thereof. In particular, the microresonator includes a dielectric layer to decrease the acoustic velocity in the transducer domain of the microresonator. The methods herein can be employed to, e.g., determine the optimal acoustic velocity that minimizes spurious responses and then to associate that optimal acoustic velocity with a particular thickness of a dielectric layer that provides that velocity.

The methods can be employed with any useful microresonator. In one instance, the microresonator includes a plurality of layers: a piezoelectric layer including a top surface and bottom surface, a top electrode layer disposed on the top surface of the piezoelectric layer (e.g., including a portion of the top surface), and an optional bottom electrode layer disposed on the bottom surface of the piezoelectric layer (e.g., including a portion of the bottom surface). The stack including the plurality of layers can optionally include one or more dielectric layers. In one instance, the stack can include a top dielectric layer disposed on a top surface of the stack (e.g., on a top surface of the top electrode layer and/or on a top surface of the piezoelectric layer) and/or a bottom dielectric layer disposed on a bottom surface of the stack (e.g., on a bottom surface of the bottom electrode layer and/or on a bottom surface of the piezoelectric layer).

Figure 1A:
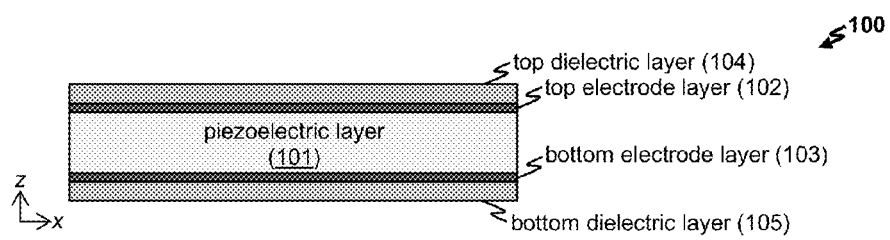
FIG. 1A-1D shows schematics of exemplary microresonators. Provided are (A) a cross-sectional view of an exemplary microresonator 100 including various layers; (B) a cross-sectional view of an exemplary microresonator 1000 having a plurality of fingers in the top electrode layer 1002; (C) a cross-sectional view of an exemplary four-finger microresonator 1100 and a three-finger microresonator 1110; and (D) a perspective view of an exemplary microresonator 1200.

FIG. 1A-1D shows schematics of exemplary microresonators. FIG. 1A shows an exemplary microresonator 100 having a plurality of layers, including a piezoelectric layer 101 having a top surface and a bottom surface, in which each surface extends along the x-axis (e.g., within the x-y plane). The top electrode layer 102 can be disposed on the top surface of the piezoelectric layer 101, and an optional bottom electrode layer 103 can be disposed on the bottom surface of the piezoelectric layer 101. Furthermore, one or more optional dielectric layers can be included within the microresonator stack. For instance, a top dielectric layer 104 can be disposed on a top surface of the stack, e.g., a top surface of the top electrode layer 102. In another instance, a bottom dielectric layer 105 can be disposed on a bottom surface of the stack, e.g., a bottom surface of the bottom electrode layer 103.

Figure 1B:
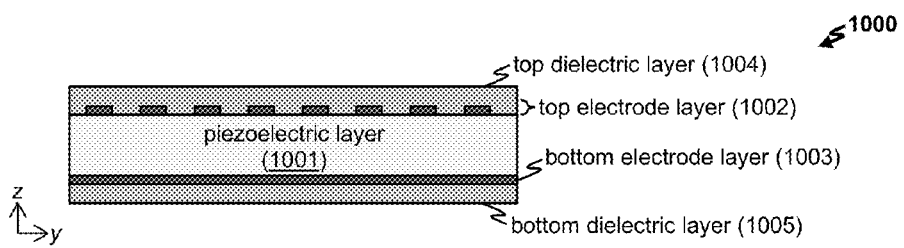

The microresonator can include any useful number or configuration of electrodes. FIG. 1B shows another exemplary microresonator 1000, in which the top electrode layer 1002 includes a plurality of fingers and the bottom electrode layer 1003 includes a planar electrode. As can be seen, the microresonator 1000 also includes a top dielectric layer 1004 disposed on a top surface of the top electrode layer 1002 and disposed on a portion of the piezoelectric layer 1001. In some instances, to provide a temperature compensated microresonator, the stack also includes a bottom dielectric layer 1005 disposed on a bottom surface of the stack.

Figure 1C:
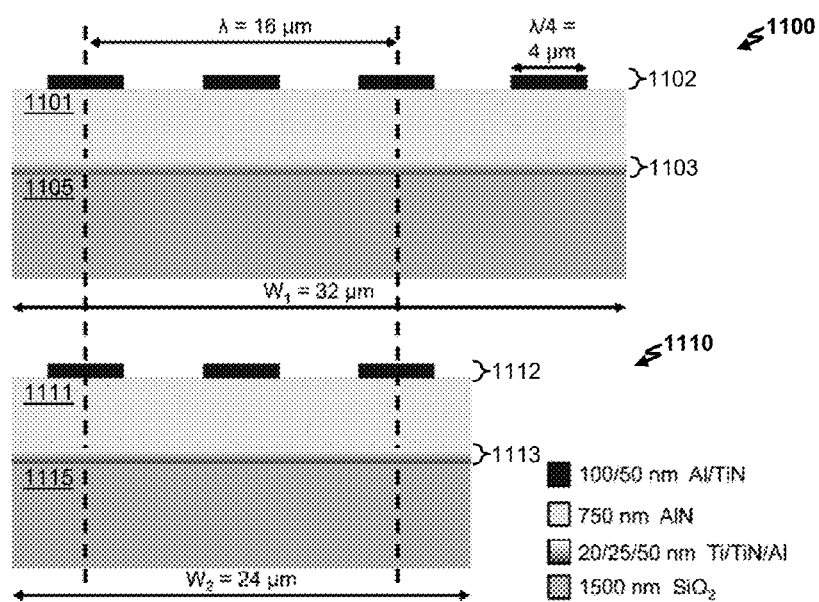

FIG. 1C shows exemplary temperature compensated microresonators with a plurality of fingers. Shown are an exemplary microresonator 1100 having four fingers in the top electrode layer 1102 (top, FIG. 1C) and an exemplary microresonator 1110 having three fingers in the top electrode layer 1112 (bottom, FIG. 1C). The four-finger microresonator can be designed to operate in the 4th overtone of the S0

Lamb mode with an acoustic wavelength λ of 16 μm and an operating frequency of 494 MHz. The three-finger microresonator can be designed to operate in the 3rd overtone of the S0 Lamb mode, also with an acoustic wavelength λ of 16 μm and an operating frequency of 494 MHz. Each microresonator 1100,1110 also includes a piezoelectric layer 1101,1111; a bottom electrode layer 1103,1113; a bottom dielectric layer 1105,1115; and can also include an optional top dielectric layer.

The top electrode layer can include an input electrode that receives electric current from a source or from a connected element, such as another microresonator, as well as an output electrode, in which an electric current exits the micro-resonator (e.g., where such electric current is received by a connected element, such as another microresonator). The bottom electrode layer can include an electrode that is grounded. In operation, an electric field can be applied across the piezoelectric layer, which induces displacement of the piezoelectric layer by way of the piezoelectric effect. The input electrode can be employed to drive acoustic resonance of the microresonator, while the output electrode can be employed to sense the acoustic resonance of the microresonator.

Optionally, the microresonator can be suspended above a substrate upon which the microresonator is formed by an air or vacuum gap. The plate thickness can be on the order of one acoustic wavelength (or less) at resonance. Furthermore, in an exemplary embodiment, the microresonator need not include the bottom electrode.

Figure 1D:
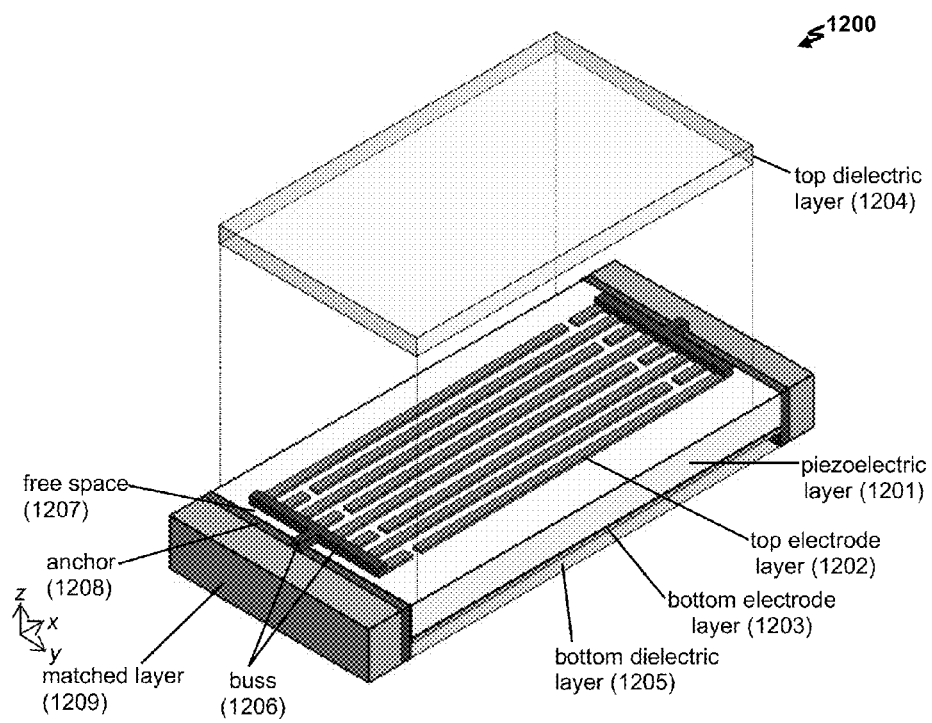

FIG. 1D provides yet another exemplary microresonator 1200 having a top dielectric layer 1204 disposed over the transducer domain that is defined by the top electrode layer 1202. In addition, the top electrode layer 1202 is disposed on the top surface of the piezoelectric layer 1201, and a bottom electrode layer 1203 is disposed on the bottom surface of the piezoelectric layer 1201. Finally, a bottom dielectric layer 1205 extends along the bottom surface of the microresonator stack. A matched layer 1209 and an anchor 1208 are located along each end of the microresonator 1200. Each buss 1206 contacts the anchor 1208, and a free space 1207 is located between the buss 1206 and the anchor 1208 to provide electrical isolation.

As described herein, the top electrode layer 1202 includes an input electrode and an output electrode. A buss 1206 (interconnect buss) is associated with each electrode, and each electrode includes a plurality of fingers that extend orthogonally from the buss 1206. Each finger in the plurality of fingers has a first length; in an exemplary embodiment, lengths of the fingers can depend upon a desired resonant frequency of the acoustic microresonator. For example, each finger in the plurality of fingers can have a same length.

In one instance, the input electrode further includes a plurality of stubs, in which each stub extends orthogonally from the buss and in parallel with the plurality of fingers. For instance, no two stubs in the plurality of stubs can be adjacent to one another along an interconnect buss; rather, two stubs in the plurality of stubs are separated by a respective one of the fingers in the plurality of fingers. Likewise, no two fingers in the plurality of fingers can be directly adjacent to one another along the interconnect buss; rather, two fingers are separated by a respective stub in the plurality of stubs. In some embodiments, the length of the finger is greater than the length of the stub.

The output electrode can be configured similarly to the input electrode (e.g., including a plurality of fingers and a plurality of stubs, in which each finger and each stub extends orthogonally from an interconnect buss; and in which each finger and each stub are parallel to each other). In some embodiments of the output electrode, no two fingers in the plurality of fingers can be adjacent to one another along an interconnect buss, no two stubs in the plurality of stubs can be adjacent to one another along an interconnect buss, and/or the length of the finger is greater than the length of the stub.

Furthermore, in some embodiments, the fingers (and stubs, if present) of the input electrode and the output electrode are interdigitated. In one instance, the stubs in the input electrode are in substantial alignment with fingers in the output electrode; and/or the fingers in the input electrode are in substantial alignment with stubs in the output electrode. In other embodiments, each end of each finger and/or stub has rounded edges (e.g., to avoid sharp corners).

Figure 2A:
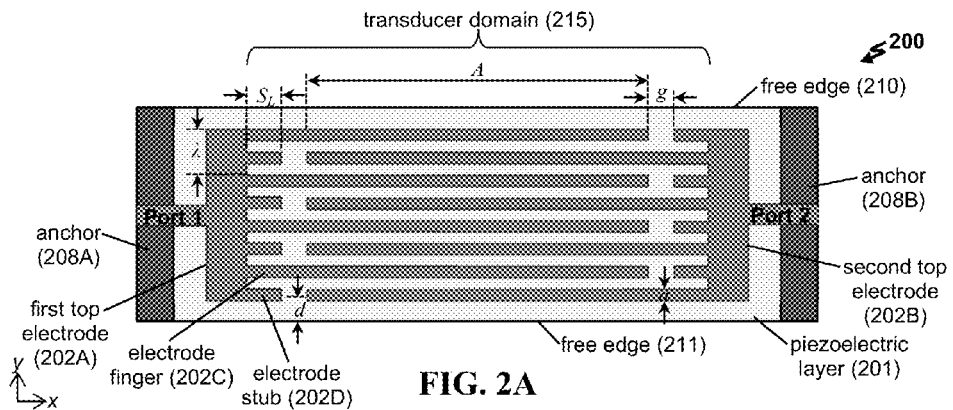
FIG. 2A-2B shows schematics of exemplary microresonators and its various dimensions. Provided are (A) a plan view of an exemplary microresonator 200; and (B) a cross-sectional view of another exemplary microresonator 2000.
Figure 2B:
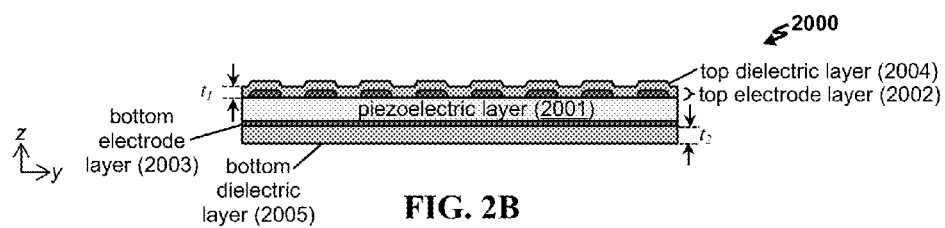

FIG. 2A provides a top view of the microresonator 200 showing two electrodes: a first top electrode 202A forming the first port (port 1) and a second top electrode 202B forming the second port (port 2). As can be seen, each top electrode is associated with an anchor 208A,208B disposed at the end of the piezoelectric layer 201. Each electrode includes a plurality of electrode fingers 202C and electrode stubs 202D disposed between the free edges 210,211 of the microresonator. FIG. 2B shows a cross-sectional view of another exemplary microresonator 2000, which includes a top dielectric layer 2004 that is conformal to the underlying electrode fingers, a top electrode layer 2002 including a plurality of electrodes, a piezoelectric layer 2001, a bottom electrode layer 2003, and a bottom dielectric layer 2005.

Various dimensions of the microresonator can be optimized. Exemplary dimensions are provided in FIG. 2A-2B for a microresonator 200,2000 having an aperture A, a transducer domain 215, a gap g between the stub and the finger, a stub length $S_L$, an acoustic wavelength λ as determined by the periodicity of the electrodes, a free edge-to-electrode distance d, an electrode width a, a thickness $t_1$ of the top dielectric layer, and a thickness $t_2$ of the bottom dielectric layer. Each of these parameters may be optimized to provide the desired quality factor Q, impedance matching, temperature compensation, and reduction of spurious modes.

In one instance, the microresonator can be of a relatively small size, such as on the order of 500 μm in length, 150 μm in width, and 10 μm in thickness. For instance, the microresonator can be less than 300 μm in length, less than 70 μm in width, and less than 2 μm in thickness.

Figure 3:
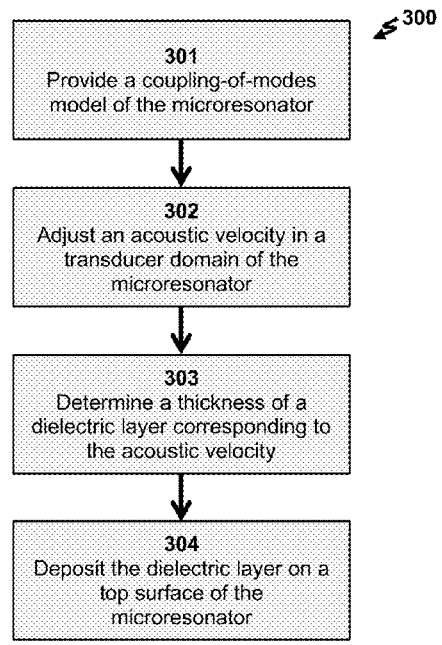
FIG. 3 shows a flowchart of an exemplary method 300 for suppressing one or more spurious modes in a microresonator.

Microresonator dimensions may be determined by any useful method. In one instance, as seen in FIG. 3, the method 300 includes providing 301 a coupling-of-modes (COM) model of the microresonator; adjusting 302 an acoustic velocity in a domain of the model (e.g., a transducer domain), e.g., to provide a minimized spurious response; determining 303 a thickness of a dielectric layer that corresponds to the acoustic velocity of the minimized spurious response; and depositing 304 the dielectric layer on a top surface of the microresonator (e.g., within or upon the transducer domain), where the dielectric layer has a thickness from the determining step. In one embodiment, the method results in suppressing one or more spurious modes in a microresonator.

The COM model can include any useful representation of the acoustic waves to simulate operation in the microresonator. In one instance, the model includes a forward acoustic wave and a backward acoustic wave that characterizes the microresonator, and the microresonator in turn can include a transducer domain having one or more electrodes. Additional details in an exemplary COM model are described herein.

Upon formulating the COM model, various parameters may be tuned to reduced spurious modes. In one instance, the parameter is the acoustic velocity in a particular region of the model, such as the transducer domain, the stub domain, the free space domain, and/or the buss domain. For example, reduction of the acoustic velocity in the transducer domain generally minimizes spurious responses. Nonetheless, past a certain optimal acoustic velocity, further reduction provides reduced impedance matching, which in turn can lower the quality factor. Thus, an optimal acoustic velocity can be determined using this model.

Next, the optimal acoustic velocity can be correlated to a particular thickness of a dielectric layer, which can provide that acoustic velocity when deposited in the proper domain (e.g., the transducer domain). This correlation can be determined in any useful manner, e.g., by a numerical analysis that solves for the acoustic velocity in the cross-section of the dielectric material to be deposited. Such numerical analyses are known, such as by employing finite element method analysis. Other analytical methods include a transfer matrix method, an iterative method, a finite difference method, or a finite volume method.

Upon determining the correlated thickness, a dielectric material having that thickness can be deposited on the microresonator. The depositing step can be conducted in any useful manner (e.g., chemical vapor deposition (CVD) such as plasma enhanced chemical vapor deposition (PECVD) or low pressure chemical vapor deposition (LPCVD), physical vapor deposition (PVD), atomic layer deposition (ALD), etc.).

In addition, in some embodiments, the microresonator can be fabricated through conventional integrated circuit (IC) fabrication techniques. The acoustic microresonator can be employed in a variety of applications. For example, the acoustic microresonator can be a portion of a filter that is used in connection with detecting electromagnetic frequencies, such as those used to transmit communications to and from mobile communications devices. Further, the acoustic microresonator can be included in a chip that includes numerous (tens to hundreds) of microresonators, where such microresonators may have differing resonant frequencies (e.g., of from about 32 kHz to about 10 GHz). It is therefore to be understood that the microresonator can be comprised by a suitable mobile communications device, such as a mobile telephone, a military communications device, or the like.

Piezoelectric Layer

The microresonator of the present invention can include a piezoelectric layer to provide and propagate the acoustic wave. The piezoelectric layer can include any useful piezoelectric material (e.g., any described herein) in any useful form (e.g., a film). Exemplary piezoelectric materials include aluminum nitride (AlN), zinc oxide (ZnO), lead zirconate titanate (PZT or $Pb[Zr_xTi_{1-x}]O_3$, where $0 \leq x \leq 1$, such as $PbZr_{0.52}Ti_{0.48}O_3$), barium strontium titanate (BST or $Ba_{0.5}Sr_{0.5}TiO_3$), lithium tantalate ($LiTaO_3$), lithium niobate ($LiNbO_3$), potassium niobate ($KNbO_3$), quartz ($SiO_2$, such as an $\alpha$-$SiO_2$), langatate ($La_3Ga_{5.5}Ta_{0.5}O_{14}$), langasite ($La_3Ga_5SiO_{14}$), langanite ($La_3Ga_{5.5}Nb_{0.5}O_{14}$), cadmium sulfide (CdS), berlinite ($AlPO_4$), gallium phosphate ($GaPO_4$), lithium iodate ($LiIO_3$), lithium tetraborate ($Li_2B_4O_7$), bismuth germanium oxide ($Bi_{12}GeO_{20}$), etc. provided in any useful orientation, e.g., 36° YX $LiTaO_3$, Y+36° cut $LiTaO_3$, 0° X-cut $LiTaO_3$, 128° XY $LiNbO_3$, 41° YX $LiNbO_3$, 64° YX $LiNbO_3$, rotated Y-cut quartz, or 36° Y quartz.

Electrode Layers

The electrode layer can include any useful arrangement of electrodes, interconnect busses, contact lines, etc., to provide an electrical connection to and from the piezoelectric layer. In one instance, the electrode layer can include an input electrode (e.g., to deliver an electrical signal to the piezoelectric layer) and an output electrode (e.g., to receive an electrical signal associated with the acoustic wave transmitted through the piezoelectric layer).

The input and output electrodes can have any useful structure. In one instance, the input electrode includes a first interconnect buss that is employed to electrically connect the microresonator with another element. The input electrode can further include a first plurality of fingers that extend orthogonally from the first interconnect buss. Accordingly, fingers in the first plurality of fingers can be parallel with one another. Each finger in the first plurality of fingers can have a first length.

The input electrode can also include a first plurality of stubs that extend orthogonally from the first interconnect buss, such that stubs in the first plurality of stubs are in parallel with one another and also in parallel with fingers in the first plurality of fingers. In some embodiments, each stub in the first plurality of stubs has a second length, where the second length is less than the first length (the length of fingers in the first plurality of fingers).

In an exemplary embodiment, stubs in the first plurality of stubs are disposed adjacent to fingers in the first plurality of fingers along the first interconnect buss. Accordingly, in one non-limiting embodiment, no finger in the first plurality of fingers is adjacent to any other finger in the first plurality of fingers along the first interconnect buss; rather, any two fingers are separated by a stub. In another non-limiting embodiment, stubs are not immediately adjacent to one another along the first interconnect buss; instead, any two stubs are separated by a finger.

In one embodiments, the output electrode of the acoustic microresonator can include a second interconnect buss that is parallel to the first interconnect buss. Additionally, the first plurality of fingers and the first plurality of stubs can extend from the first interconnect buss towards the second interconnect buss. The output electrode can optionally include a second plurality of fingers that extend orthogonally from the second interconnect buss towards the first interconnect buss. In other embodiments, the output electrode can include a second plurality of stubs that extend orthogonally from the second interconnect buss towards the first interconnect buss, such that the first plurality of fingers, the first plurality of stubs, the second plurality of fingers, and the second plurality of stubs are in parallel with one another.

The fingers and stubs, if present, can have any useful dimension. In some embodiments, each finger in the second plurality of fingers has a length that is greater than respective lengths of stubs in the second plurality of stubs. The output electrode can be structured in a similar manner to the input electrode (e.g., rotated 180 degrees). Accordingly, in other embodiments, no two fingers are adjacent to one another along the second interconnect buss, and no two stubs are adjacent to one another along the second interconnect buss. Rather, any two fingers are separated by a stub, and any two stubs are separated by a finger.

Further, in yet other embodiments, fingers in the first plurality of fingers can be substantially aligned with stubs in the second plurality of stubs. Likewise, fingers in the second plurality of fingers can be substantially aligned with stubs in the first plurality of stubs. The selective inclusion and placement of the stubs in the input electrode and the output electrode can be optimized to facilitate prevention of reflectance of acoustic waves into the acoustic microresonator, thereby facilitating prevention of spurious modes. Further, each finger in the first plurality of fingers and second plurality of fingers and each stub in the first plurality of stubs and the second plurality of stubs can have rounded ends, e.g., such that sharp corners are avoided. The structure of the electrode can be optimized to provide increased accuracy and reliability when the acoustic microresonator is employed as a filter mechanism, for example, in a mobile communications device.

As described herein, the electrodes can be of any useful configuration (e.g., an interdigitated configuration, an arrayed configuration, a gate configuration, a one-port configuration, a two-port configuration, a delay line configuration, a unidirectional configuration, a bidirectional configuration, etc.), geometry (e.g., bar electrodes, planar electrodes, single finger electrodes, double finger electrodes, split finger electrodes, pruned double split finger electrodes, etc.), orientation (e.g., having a major axis that is orthogonal to a first direction that is the propagate direction of the acoustic wave and/or configured to provide an acoustic wave along a crystal cut or axis that supports acoustic waves), or electrical connection (e.g., shorted, grounded, open, closed, arrayed, etc.). In one instance, the electrodes form an interdigitated transducer (IDT), in which the fingers of each electrode are interdigitated. The design of the IDT can be selected from single finger electrodes, double split finger electrodes, pruned double split finger electrodes, or unidirectional electrodes (e.g., a single-phase unidirectional transducer (SPUDT)). Other electrode configurations are described in U.S. Pat. Nos. 5,073,763, 6,777,855, 7,173,360, 7,878,063, 8,436,509, and 8,669,688, each of which is incorporated herein by reference in its entirety.

The electrode layer can include any useful material or useful layers of materials. Exemplary materials include a conductive material, an ohmic metal, an adhesion material, a metal oxide, an antioxidizing layer, including multilayered forms and/or doped forms thereof. Exemplary materials include titanium, titanium nitride, chromium, tungsten, aluminum, platinum, silver, gold, and silver, including combinations thereof, layers thereof, and/or alloys thereof. In addition, each electrode can include one or more lines (e.g., bonding wires), which in turn may optionally be connected to one or more contacts (e.g., contact pads configured to provide an electrical connection to the electronics module).

Dielectric Layers

The dielectric layer can include any useful dielectric material or useful layers thereof. Exemplary dielectric materials include silicon oxide (e.g., $SiO_2$ or $SiO_x$), silicon nitride (e.g., $Si_3N_4$ or $SiN_x$), silicon oxynitride (e.g., SiON or $SiO_xN_y$), or titanium oxide (e.g., $TiO_2$), which can optionally include any useful dopant (e.g., Al). The dielectric layer can be of any useful thickness, such as of from about 0.05 µm to about 20 µm (e.g., from 0.05 µm to 1 µm, 0.05 µm to 0.05 µm to 5 µm, 0.05 µm to 10 µm, 0.1 µm to 1 µm, 0.1 µm to 2 µm, 0.1 µm to 5 µm, 0.1 µm to 10 µm, 0.1 µm to 20 µm, 0.5 µm to 1 µm, 0.5 µm to 2 µm, 0.5 µm to 5 µm, 0.5 µm to 10 µm, 0.5 µm to 20 µm, 0.7 µm to 1 µm, 0.7 µm to 2 µm, 0.7 µm to 5 µm, 0.7 µm to 10 µm, 0.7 µm to 20 µm, 1 µm to 2 µm, 1 µm to 5 µm, 1 µm to 10 µm, 1 µm to 20 µm, 2 µm to 5 µm, 2 µm to 10 µm, 2 µm to 20 µm, 5 µm to 10 or 5 µm to 20 µm).

EXAMPLE

Example 1: Suppressing Fine-Frequency Modes in Aluminum Nitride Microresonators Eliminating spurious modes in aluminum nitride (AlN) microresonators improves their insertion loss and quality factor by reducing acoustic energy leakage. Spurious modes that result from transverse wave propagation (termed fine-frequency modes) can leak energy and propagate in the electrical bussing. Such spurious modes can also appear near the fundamental resonance, which can degrade signal processing. Although these modes can be predicted using three-dimensional (3D) finite element methods (FEM) for devices with very short acoustic length (e.g., 1 acoustic wavelength), 3D FEM is very slow and memory intensive when compared to a two-dimensional (2D) simulation. Here, we have developed a fast 2D coupling-of-modes (COM) model to predict, identify, and implement strategies to suppress the fine-frequency modes, as described herein.

Aluminum nitride (AlN) microresonators are known for their ability to realize multiple frequency filters on a single chip with frequencies ranging from 10 MHz to 10 GHz (see, e.g., Piazza G et al., "Piezoelectric aluminum nitride thin films for microelectromechanical systems," *MRS Bull.* 2012; 37(11):1051-61). Their small size, high quality factor Q, relaxed lithographic requirements, and temperature compensation using a dielectric (e.g., silicon dioxide) make them ideal for frequency control applications and integration with CMOS.

The transduction mechanism is primarily based on the lowest-order symmetric Lamb wave (S0) propagating in a thinly supported membrane with an unloaded acoustic velocity in excess 10,000 m/s. Due to the width extensional (WE) excitation of Lamb waves using the $d_{31}$ coupling and the free edges as broadband reflectors, a size reduction of 100× can be achieved compared to their surface acoustic wave (SAW) counterparts. Though the frequency and impedance of the width extensional mode is easily adjusted to accommodate a variety of different filter requirements, the presence of spurious modes degrades filter performance and limits applications (see, e.g., Olsson R H et al., "Post-CMOS compatible aluminum nitride MEMS filters and resonant sensors," *Joint IEEE International Frequency Control Symposium with the 21st European Frequency and Time Forum*, held on 29 May-1 Jun. 2007 in Geneva, Switzerland (pp. 412-9); Piazza G et al., "Two-port stacked piezoelectric aluminum nitride contour-mode resonant MEMS," *Sens. Actuat. A* 2007; 136(2):638-45; and Branch D W et al., "Elucidating the origin of spurious modes in aluminum nitride microresonators using a 2-D finite-element model," *IEEE Trans. Ultrason. Ferroelectr. Frequency Control* 2014; 61(5):729-38).

Spurious modes are known to originate from several sources, such as flexural wave propagation, acoustic interaction with the anchoring and bussing, and, more recently, mode conversion. In all these cases, the presence of spurious modes is dependent on the boundary conditions of the resonator at both the free-plate edges and the electrical bussing terminations. Though the free-plates edges provide high reflectivity without increasing the size of the resonator, their broadband response does not suppress out-of-band spurious modes in contrast to Bragg reflectors. In some cases, mode conversion between the symmetric Lamb waves S0 and S1 at the plate edges has been observed to play a key role in spurious mode generation (see, e.g., Thalmayr F et al., "Fast evaluation of Lamb wave scattering by time harmonic FEM simulation," *IEEE International Ultrasonics Symposium*, held on 20-23 Sep. 2009 in Rome, Italy (pp. 2805-9)).

Mode conversion also can occur between the lowest-order (S0) symmetric Lamb wave and the anti-symmetric (A1) Lamb wave at specific wavelengths in temperature compensated AlN devices (see, e.g., Branch D W et al., *IEEE Trans.*

*Ultrason. Ferroelectr. Frequency Control* 2014; 61(5):729-38). These large spurious modes can be suppressed by shifting the operating wavelength to avoid proximity of A1 and S0 modes. The smaller spurious or fine-frequency modes that appear near the fundamental resonance are from transverse wave propagation leaking energy into the bussing, which will be referred to as spurious modes in this work.

Suppressing fine-frequency modes requires reducing energy leakage into the bussing where it can propagate and causes small modes (~3 dB P-P) to appear near the fundamental resonance (see, e.g., Olsson R H et al., "Origins and mitigation of spurious modes in aluminum nitride microresonators," *IEEE Ultrasonics Symposium*, held on 11-14 Oct. 2010 in San Diego, Calif. (pp. 1272-6)). The fine-frequency modes are a function of the boundary conditions of the resonator at the electrical bussing terminations.

Several strategies have been investigated to suppress these modes, such as by using a narrow aperture to increase the separation of the transverse modes, apodization of the transducer or reflector (see, e.g., Haydl W H et al., "Multimode SAW resonators—A method to study the optimum resonator design," *IEEE Ultrasonics Symposium*, held on 29 Sep.-1 Oct. 1976 in Annapolis, Md. (pp. 287-96)) or by using dummy fingers in the transducer (see, e.g., Yamamoto Y et al., "SAW transversely guided mode spurious elimination by optimization of conversion efficiency using W/W0 electrode structure," *IEEE Ultrasonics Symposium*, held on 5-8 Oct. 1998 in Sendai, Japan (vol. 1, pp. 229-34)). Apodization is not desirable, especially in AlN microresonators, since it degrades the Q of the resonator and increases insertion loss. More recent suppression strategies aim to confine the acoustic energy by requiring that the acoustic velocity in the transducer region is smaller than the bussing and external regions (see, e.g., Nakamura H et al., "Suppression of transverse-mode spurious responses for saw resonators on $SiO_2$/Al/$LiNbO_3$ structure by selective removal of $SiO_2$," *IEEE Trans. Ultrason. Ferroelectr. Frequency Control* 2011; 58(10):2188-93).

Simulation methods to study transverse mode propagation include scalar potential theory (SCP) (see, e.g., Yamamoto Y et al., *IEEE Ultrasonics Symposium*, held on 5-8 Oct. 1998 in Sendai, Japan (vol. 1, pp. 229-34); and Schmidt R V et al., "Thin-film acoustic surface waveguides on anisotropic media," *IEEE Trans. Sonics Ultrason.* 1975; 22(2):115-22), two-dimensional (2D) coupling-of-modes (2D COM) (see, e.g., Haus H A, "Modes in SAW grating resonators," *J. Appl. Phys.* 1977; 48:4955-61; Hirota K et al., "Analysis of SAW grating waveguides using 2D coupling-of-modes equations," *IEEE Ultrasonics Symposium*, held on 7-10 Oct. 2001 in Atlanta, Ga. (pp. 115-20); and Tokuda O et al., "Two-dimensional coupling-of-modes analysis in surface acoustic wave device performed by COMSOL multiphysics," *Jpn. J. Appl. Phys.* 2011; 50(7S):07HD15 (5 pp.)), 2D P-matrix methods (see, e.g., Kovacs G, "A generalised P-matrix model for SAW filters," *IEEE Symposium on Ultrasonics*, held on 5-8 Oct. 2003 in Honolulu, Hi. (vol. 1, pp. 707-10); and Wagner K et al., "A 2D P-matrix model for the simulation of waveguiding and diffraction in SAW components," *IEEE Ultrasonics Symposium*, held on 2-6 Oct. 2006 in Vancouver, BC, Canada (pp. 380-8)) and the three-dimensional (3D) finite element method (3D FEM).

Figure 4:
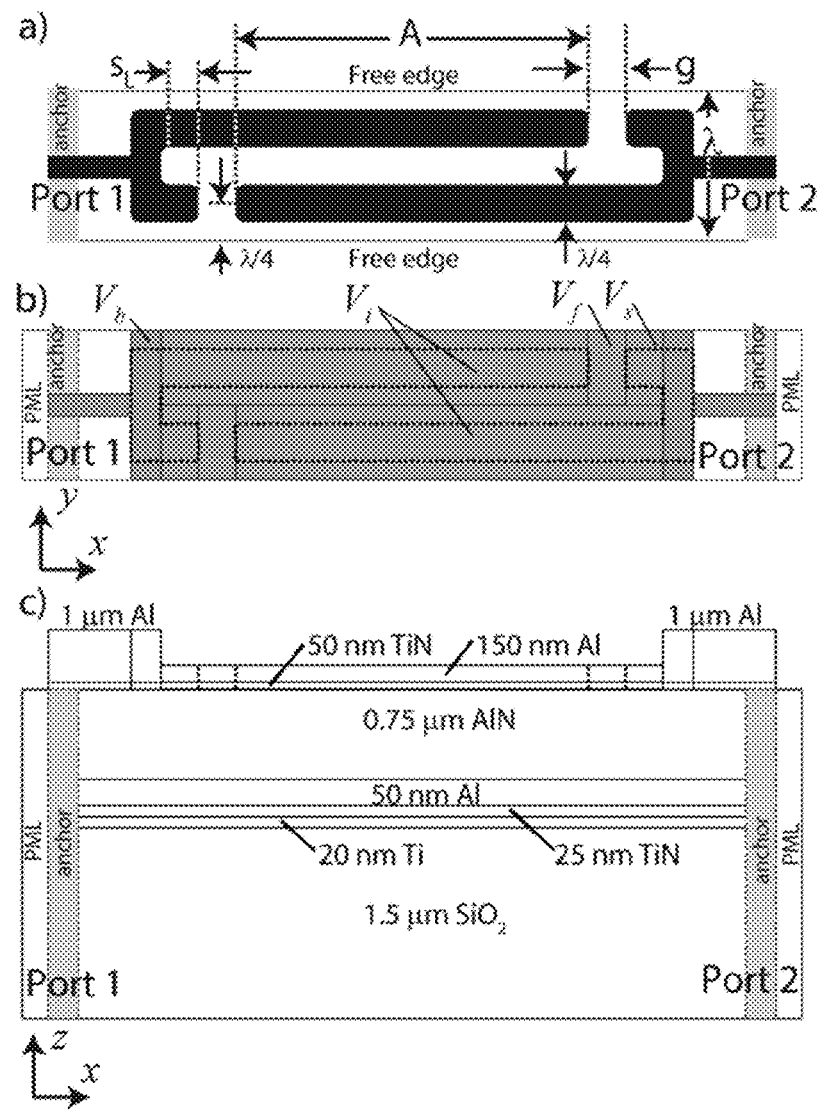
FIG. 4 shows an exemplary two-port AlN microresonator showing the input and output fingers connected to Port 1 and Port 2 for an $N_t=2$ active fingers. Provided is (a) a plan view of the microresonator showing a top metal layer (black) including the transducer fingers and bussing. The finger-to-stub gap (g) and stub length ($S_L$) are also shown. The electrical ground is located underneath the entire structure. The period $p=\lambda/2$. Also provided is (b) an equivalent field model for the 2D COM simulation showing various domains (the buss domain, the transducer domain, the free space domain, and the stub domain) and their respective velocity designations ($v_b$, $v_t$, $v_f$, and $v_s$, respectively). The dotted region is the outline of the actual fingers, bussing, and stubs in relation to the field model. Also provided is (c) a cross-sectional view of the AlN microresonator and its components.

SCP is a fast simulation method that is used to determine the length of stubs to suppress individually targeted transverse modes. It does not address 2D variation along the acoustic length or directly compute the electrical response. In contrast, the simulation time for the 3D FEM is still formidable since the thin electrode layer stacks used in AlN microresonators must be finely discretized. In some cases, effective material parameters approaches reduce the DOF but this still limits practical designs to a low number of electrode fingers, $N_f$~8, with RAM requirements about 50-100 Gb due to meshing the thin films (FIG. 4).

The 2D COM method is an intermediate model that can capture the physical effects of the electrical buss and transducer geometry without relying on 3D FEM. This work applies the 2D COM method across the entire structure. A separate 2D FEM model was used to calculate the COM parameters in the various domains for the 2D COM model.

Analysis: Theory of 2D COM Equations

The 2D COM equations have previously been derived using the paraxial approximation, which assumes the fields vary gradually along the axis of the independent variable (see, e.g., Haus H A, *J. Appl. Phys.* 1977; 48:4955-61; and Tokuda O et al., *Jpn. J Appl. Phys.* 2011; 50(7S):07HD15 (5 pp.)). It is convenient to write the 2D COM equations in the partial differential equation (PDE) form as follows:

$$e_a \frac{\partial^2 u}{\partial t^2} + d_a \frac{\partial u}{\partial t} - \nabla \cdot (-c\nabla u + \alpha u - \gamma) + \beta \cdot \nabla u + au = f, \quad \text{(Eq. 1)}$$

noting that the time dependent mass ($e_a$), damping ($d_a$), conservative flux ($\gamma$), and convection ($\beta$) terms are all zero. The 2D COM equations that involve the acoustic amplitudes can be written in the form of Eq. (1) as follows:

$$\nabla \cdot (-c\nabla u) = \nabla \cdot j \begin{bmatrix} \begin{bmatrix} 0 & 0 \\ 0 & -\frac{\gamma_a}{2k_o} \end{bmatrix} & [0] \\ [0] & \begin{bmatrix} 0 & 0 \\ 0 & \frac{\gamma_a}{2k_o} \end{bmatrix} \end{bmatrix} \begin{bmatrix} \frac{\partial A^+}{\partial y} \\ 0 \\ \frac{\partial A^-}{\partial y} \end{bmatrix} \quad \text{(Eq. 2)}$$

$$\nabla \cdot (-\alpha u) = \begin{bmatrix} 1 & 0 \\ 0 & 0 \\ 0 & 1 \\ 0 & 0 \end{bmatrix} \begin{bmatrix} \frac{\partial A^+}{\partial x} \\ \frac{\partial A^-}{\partial x} \end{bmatrix}$$

$$a = j \begin{bmatrix} -\delta & -\kappa_{12} \\ \kappa_{12}^* & \delta \end{bmatrix}$$

$$f = \begin{bmatrix} -\alpha V \\ \alpha^* V \end{bmatrix}$$

$$u = \begin{bmatrix} A^+ \\ A^- \end{bmatrix}$$

$$\delta = k - k_o - j\gamma,$$

where the $A^+$ and $A^-$ are the forward and backward acoustic amplitudes, respectively; $k_o$ is the wavenumber of the periodic structure; k is the wavenumber; $\gamma_a$ is the anisotropy parameter ($\gamma_a$~1 for AlN); $\gamma$ is the attenuation constant (Np/m); $\kappa_{12}$ is the reflectivity parameter; $\alpha$ is the transduction coefficient; V is the input voltage ($V_i$=1); and $\delta$ is the detuning parameter or wavenumber deviation from the Bragg condition. The asterisk * indicates s complex conjugate.

The input current $I_i$ and output current $I_o$ are determined by integrating over the electrically active domains:

$$I_i(\omega) = \iint (2\alpha^* A^+ + 2\alpha A^- + j\omega C(x,y) V_i) dx dy,$$

$$I_o(\omega) = \iint (2\alpha^* A^+ + 2\alpha A^-) dx dy \quad \text{(Eq 3)}$$

where C is the static capacitance (F/m$^2$) and ω is the angular frequency. Though the static capacitance is spatially dependent, the variation is considered to be uniform across the transducer domain.

The use of an electrically grounded bottom electrode underneath the entire structure required integrating Eq. (3) in the transducer and bussing domains. Continuity between the PDE domains for the acoustic amplitudes and their derivatives was achieved using Neumann boundary conditions (see, e.g., Tokuda O et al., *Jpn. J Appl. Phys.* 2011; 50(7S): 07HD15 (5 pp.)):

$$-n_1 \cdot \Gamma_1 - n_2 \cdot \Gamma_2 = -n_1 \left[ \begin{array}{c} A^\pm \\ \pm j \frac{\gamma_a}{2k_o} \frac{\partial A^\pm}{\partial y} \end{array} \right]_1 - n_2 \left[ \begin{array}{c} A^\pm \\ \pm j \frac{\gamma_a}{2k_o} \frac{\partial A^\pm}{\partial y} \end{array} \right]_2 = 0, \quad \text{(Eq. 4)}$$

where subscripts 1 and 2 indicate the domains on both sides of the boundary; $n_1$ and $n_2$ are outward normal vectors from domains 1 and 2, respectively; and $\Gamma_1$ and $\Gamma_2$ are vectors including partial differentiation in each of domains 1 and 2, respectively.

Using the edges of the microresonator as broadband reflectors requires applying Dirichlet boundary conditions to obtain the following:

$$n \cdot (c\nabla u + \alpha u) + au = g - \mu \quad \text{(Eq. 5)}$$

$$\mu = \begin{bmatrix} 0 \\ 0 \end{bmatrix},$$

where reaction force μ on the boundary is zero. The expressions in Eq. (5) do not place any restrictions on the solution $A^\pm$ since μ is adjusted to satisfy the Dirichlet conditions.

In the perfectly matched layer (PML) regions, an absorbing boundary condition was used to damp incident waves by increasing the value of η to 1 along the length of the PML. The PML was defined by replacing the real wavenumber in the 2D COM equations with a complex form having a simple linear dependence:

$$k(r) \rightarrow k_f (1 - j\eta(r)) = k_f \left( 1 - j\eta_o \frac{|r - r_i|}{d} \right), \quad \text{(Eq. 6)}$$

where $\eta_o$ is the attenuation in the PML region ($\eta_o$=1), $k_f$ is the wavenumber in the free domain, $r_i$ is where the PML starts, r is the spatial coordinate, and d is the height of the PML, taken as 5·λ.

To apply Eq. (2) to the domains in FIG. 4, the wavenumber k was redefined in terms of the velocity in each domain as follows:

$$\delta = k - k_o - j\gamma = \frac{2\pi(f - f_o)}{v} - j\gamma, \quad \text{(Eq. 7)}$$

where v is the velocity in each domain (Table 1), f is frequency, and $f_o$ is the center frequency. The velocities in each domain were estimated by applying the 2D FEM to the material cross-section of each domain in the microresonator. The admittances were computed using the following:

$$Y_{11} = \frac{I_i}{V_i}\bigg|_{V_o=0}, \quad Y_{21} = \frac{I_o}{V_i}\bigg|_{V_o=0}. \quad \text{(Eq. 8)}$$

TABLE 1

Domain parameters for 2D COM

| λ = 16 μm Domain | δ | $\kappa_{12}$ρ | α [ζρ/ωC$_s$] | v [m/s] | C$^a$ [pF/p/m] |
|---|---|---|---|---|---|
| Transducer | $k_t - k_o - j\gamma$ | −0.08 | 0.004 | 7873 | 512.3 |
| Buss | $k_b - k_o - j\gamma$ | 0 | 0 | 7828 | 512.3 |
| Free space | $k_f - k_o - j\gamma$ | 0 | 0 | 7910 | 0 |
| Stub | $k_s - k_o - j\gamma$ | −0.08 | 0.004 | 7873 | 512.3 |

$^a$Additional shunt capacitance from the GSG pads was included using an external circuit.

Analysis: Structure of the Microresonator

The structure of the microresonators included a thin composite plate with input and output fingers alternating their connection from port 1 to port 2. For clarity, a device with $N_f$=2 fingers is shown in FIG. 4, depicting the locations of the bussing and fingers relative to the field model boundaries. Starting from the bottom of the AlN microresonator, the resonators included 1.5 μm of silicon dioxide (SiO$_2$), a Ti/TiN/Al (20 nm/25 nm/50 nm) bottom electrode, and 0.75 μm of AlN. The top electrode layers consisted of TiN/Al (50 nm/100 nm) (see, e.g., Olsson R H et al., *Joint IEEE International Frequency Control Symposium with the 21st European Frequency and Time Forum*, held on 29 May-1 Jun. 2007 in Geneva, Switzerland (pp. 412-9)). The free domains were un-metallized, and the bottom electrode was electrically grounded. The domain and COM parameters are summarized in Table 1.

The microresonator can be fabricated in any useful manner. In one instance, the fabrication process can begin with an anisotropic silica (Si) etch and the deposition of a silicon dioxide (SiO$_2$) layer to isolate the bottom electrode layer from the Si substrate. To form electrical contacts, a metal (e.g., tungsten) can then be deposited by chemical vapor deposition and then chemically mechanically polished until the deposited metal remains only where the Si was etched. An oxide touch polish may then be performed to further smooth the wafer surface prior to the sputter deposition and patterning of the bottom electrode layer. Two separate bottom electrode processes are described: a first process with a 50 nm Al bottom electrode; and a second process that provides a Ti/TiN/Al stack (e.g., a Ti/TiN/Al (20 nm/50 nm/50 nm) stack, a Ti/TiN/Al (20 nm/25 nm/50 nm), or a Ti/TiN/Al (20 nm/50 nm/100 nm) stack). Subsequently, 750 nm of AlN can be sputter deposited at 350° C. Using such process, highly oriented c-axis AlN films used for realizing low impedance resonators can be reliably formed.

The resonator frequency can be lithographically defined. In one instance, electrodes are patterned, trenches are etched in the AlN and SiO$_2$ to bulk Si, and the devices are released using an isotropic etch in dry SF$_6$ or XeF$_2$. In this exemplary process, the maximum temperature is 350° C., and the materials are post-CMOS compatible and can be deposited and etched using standard CMOS tools.

In another instance, for a resonator frequency in the range of 400-600 MHz, a stub length and stub spacing to the input and output electrodes of (3/4)λ was found to be substantially optimal. In yet another instance, the resonator is a temperature compensated microresonator in the 400-600 MHz frequency range with a stub length and stub spacing to the electrodes of $(5/4)\lambda$.

For any embodiment herein, the dimensions of the resonator can include one or more of the following (from the bottom to the top of the microresonator stack): a bottom dielectric layer (e.g., a $SiO_2$ layer) having a thickness of from about 700 nm to about 1500 nm; a bottom electrode layer (e.g., a Ti/TiN/Al stack) having a thickness of about 90 nm to about 200 nm (e.g., a Ti/TiN/Al (20 nm/50 nm/100 nm) stack or a Ti/TiN/Al (20 nm/25 nm/50 nm) stack); a piezoelectric layer (e.g., an AlN layer) having a thickness of from about 700 nm to about 800 nm (e.g., about 750 nm); a top electrode layer (e.g., a TiN/Al stack) having a thickness of from about 100 nm to about 300 nm (e.g., a TiN/Al (50 nm/100 nm) stack, a TiN/Al (50 nm/150 nm) stack, a TiN/Al (50 nm/200 nm) stack, or a TiN/Al (25 nm/100 nm) stack); and/or a top dielectric layer (e.g., a $SiO_2$ layer) having a thickness of from about 600 nm to about 800 nm.

To simulate the device in FIG. 4, the COM parameters for the bussing, free-space and stubs were substituted into Eq. (2). This model was implemented using the PDE mode of Comsol Multiphysics®. The 3D FEM was used to compare with measurements and the 2D COM approach.

Results: Simulated S21 Response of Microresonator Model

Figure 5A:
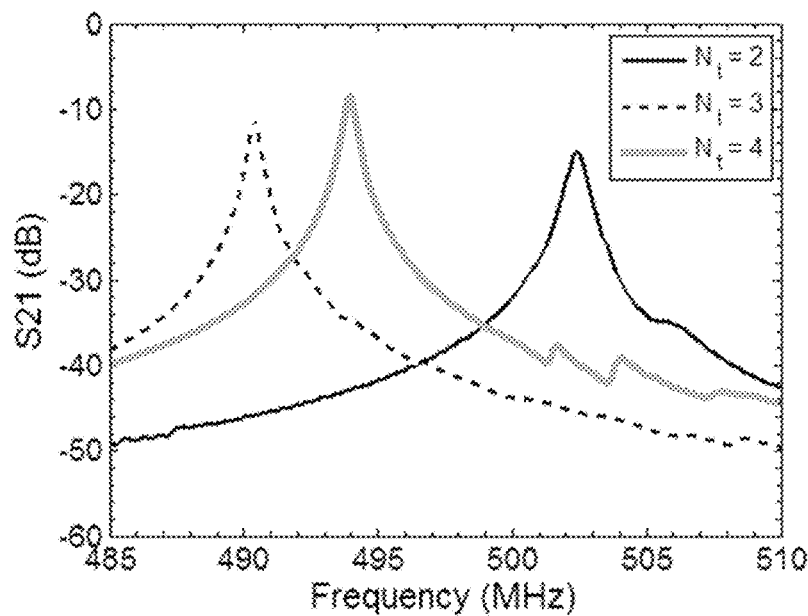
FIG. 5A-5B shows the simulated S21 response for various models of an AlN microresonator. Provided are graphs of (A) the simulated response for microresonators with $N_t=2$, 3, or 4 fingers and (B) the simulated response for microresonators with $N_t>4$ fingers. As seen in (B), fine-frequency modes (arrows) appeared near the fundamental resonance for the model of a microresonator with either $N_t=6$ fingers or $N_t=8$ fingers. The $N_t=6$ finger device also had a large anti-symmetric mode that was predicted using 3D FEM. $\lambda=16$ μm.

Microresonators including $N_f=2$, 3, 4, 6, and 8 fingers were fabricated using the previously developed fabrication process. The two-port measurements from the model are shown in FIG. 5A, which indicate that the fine-frequency modes were negligible in proximity to the fundamental resonance when $N_f \leq 4$, with several spurious modes located 30 dB down when $N_f=4$.

Figure 5B:
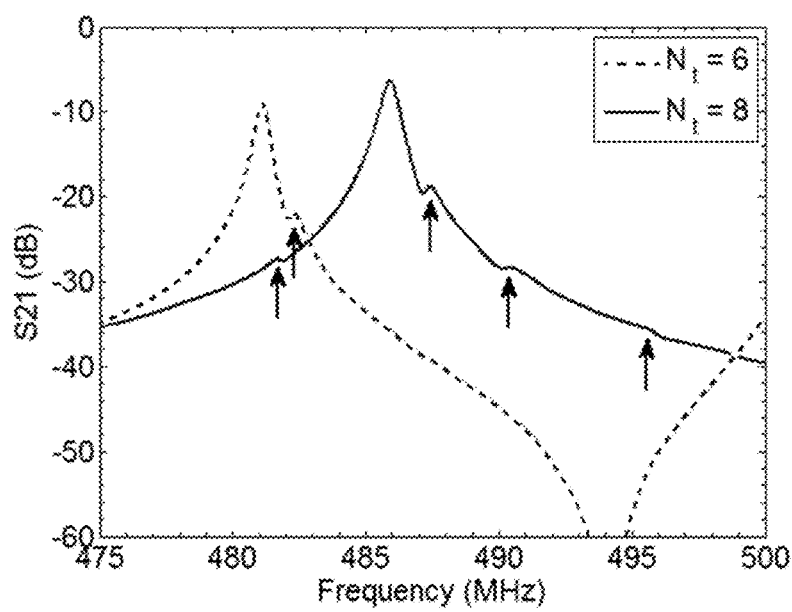

As $N_f$ was increased, the fine-frequency modes began to appear above the resonance frequency (FIG. 5B). This suggested that the acoustic length of the buss contributed to transverse mode propagation. Though the acoustic length of the buss can be reduced to suppress the transverse modes, this approach is not always practical due to the increased insertion loss. Instead, one possibility includes direct suppression, which requires modifying the impedance of the boundaries between the buss and the transducer to eliminate all the fine-frequency modes while reducing the insertion loss.

Results: 2D COM Analysis

Microresonators were simulated using 2D COM by converting them to an equivalent field model, where the acoustic ports were located $\pi/4$ from the center of the fingers (FIG. 4). The microresonators were divided into multiple domains in 2D, each with their own domain velocity: transducer ($v_t$), electrical bussing ($v_b$), stubs ($v_s$), and free regions ($v_f$) (FIG. 4(b)). Stubs were added to the bussing to aid in suppression of the fine-frequency modes, which were also included in this study (see, e.g., Olsson R H et al., *IEEE Ultrasonics Symposium*, held on 11-14 Oct. 2010 in San Deigo, Calif. (pp. 1272-6)).

Previous studies indicated that acoustic confinement occurs when the transducer velocity $v_t$ is less than the velocity in the bussing $v_b$ (see, e.g., Nakamura H et al., "Suppression mechanism of transverse-mode spurious responses in SAW resonators on a $SiO_2$/Al/LiNbO$_3$ structure," *IEEE International Ultrasonics Symposium*, held on 18-21 Oct. 2011 in Orlando, Fla. (pp. 543-6)) and free space $v_f$, i.e., $v_t < v_b < v_f$, thereby causing suppression of the fine-frequency modes. Because incident transverse waves arrive orthogonally to the electrical buss, complete reflection is achieved when $v_t < v_b$ since $\sin^{-1}(v_b/v_t)$ yields evanescent waves. Without any modification, the acoustic velocity in the electrical buss is almost always less than the velocity in the transducer ($v_b < v_t$) (Table 1). This condition causes acoustic energy to leak into the electrical buss and in turn propagate transverse modes.

Figure 6:
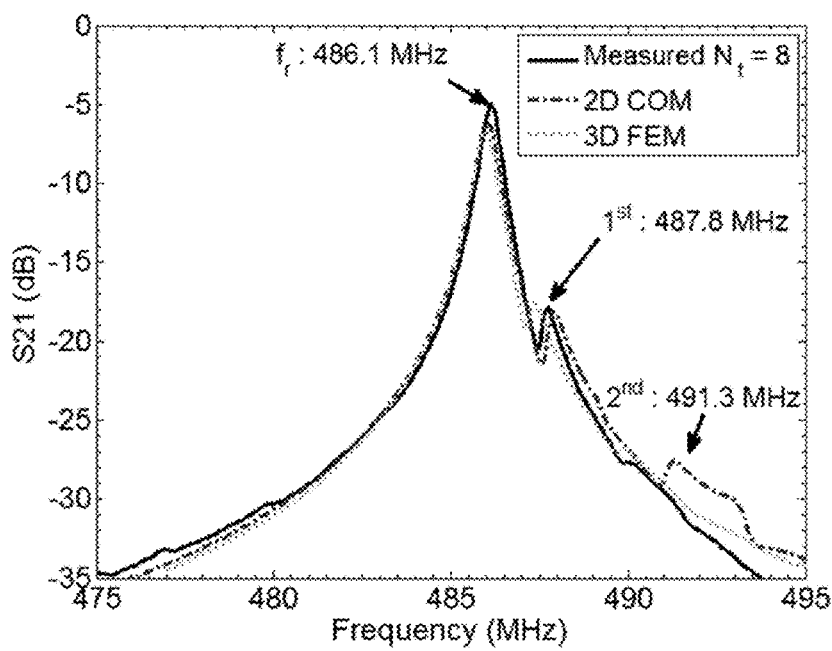
FIG. 6 shows experimental and simulated S21 responses for an AlN microresonator with $N_t=8$ fingers. The 2D COM simulation predicted two distinct spurious modes at $f_{S1}=487.8$ MHz and a second at $f_{S2}=491.3$ MHz. $\lambda=16$ μm.

FIG. 6 confirmed this finding, showing the presence of fine-frequency modes for the $N_f=8$ device. In general, the 2D COM model tracked well with the experimental measurements, where it was able to predict the first spurious modes located at −20 dB. However, the model exaggerated the amplitude of the spurious modes further away from the fundamental resonance, but preserved the shape of the spurious modes. This likely occurred for two reasons: the damping parameter $\gamma$ in the 2D COM model was independent of frequency; and the impact of the fingers on the strain is not precisely captured especially further away from resonance. Accordingly, the present invention also includes methods in which the model is further optimized by providing one or more adjustable parameters (e.g., a frequency-dependent damping parameter $\gamma$ or a frequency-dependent coupling parameter between the electrode and strain) that more accurately characterizes the frequency response of the microresonator.

From the measurements, the second spurious mode was located at 490.3 MHz, where 2D COM predicted it at 491.3 MHz. In FIG. 6, the S21 data from the 2D COM simulation for the 2nd spurious mode had a similar but frequency shifted profile compared to the measurement and 3D FEM data. In the 2D COM simulations, the quadrilateral mesh size was 1 μm, yielding a simulation time of 10 minutes using a 16-core processor machine under Linux RedHat®. The 3D FEM simulation predicted the first spurious mode at a slightly lower frequency than the measured data with smaller amplitude than measurement. However, the results of the 3D FEM were in good agreement with the spurious modes observed in the measurement. The simulation time for 3D FEM was 120 hours (5 minutes/frequency point) using a tetragonal mesh with a DOF of 4.7 million under Linux RedHat®.

Figure 7:
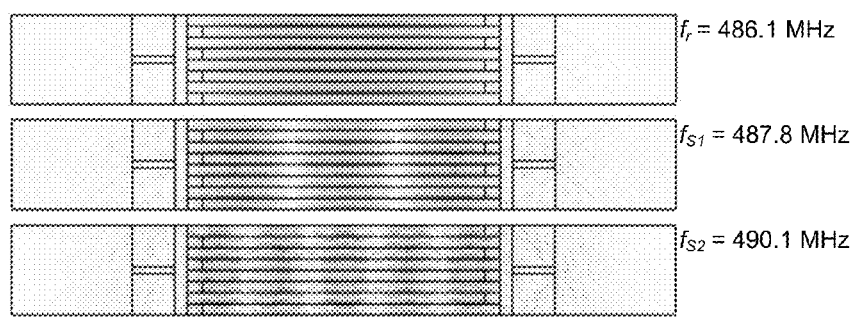
FIG. 7 shows acoustic amplitudes from 2D COM simulations for $N_t=8$ fingers. Provided are simulations for (top) $f_r=486.1$ MHz, (middle) the 1st spurious mode: $f_{S1}=487.8$ MHz; and (bottom) the 2nd spurious mode: $f_{S2}=490.1$ MHz. The light regions are the nodes. The pattern is the Lamb wave. $\lambda=16$ μm.

Using the 2D COM method, the acoustic amplitudes of transverse wave propagation were computed from the forward and backward propagating modes (FIG. 7). The two observable spurious modes are due to transverse wave propagation along the aperture. The fundamental resonance was symmetric along the aperture, where the two spurious modes appear as the 6th and 10th symmetric modes in the transverse direction. The field patterns demonstrate that the spurious modes leak more energy into the bussing and free regions in FIG. 7(*b,c*).

Results: Suppression of Fine-Frequency Modes

To suppress the spurious modes, the acoustic velocity in the transducer domain must be less than the velocity in the buss. To achieve this condition, a thin layer of silicon dioxide was added to the model in the transducer domain (FIG. 8A). To simulate the addition of the silicon dioxide in 2D COM, the acoustic velocity in the transducer domain was gradually decreased.

Structural components replicated in the model included the free domain (FIG. 8B) to determine $v_f$, the transducer domain (FIG. 8C) to determine $v_t$ and $v_s$, and the buss domain (FIG. 8D) to determine $v_b$. As can be seen in FIG. 8B, the free domain has a length $L_f = \lambda$ and includes a top dielectric layer 804 having a height $d_0$, an infinitely thin layer of the residual metallization 806, an underlying piezoelectric layer 801 having a height $d_1$, a bottom electrode layer 803 having a height $d_2$, and a bottom dielectric layer 805 having a height $d_3$.

As can be seen in FIG. 8C, the transducer and stub domains has electrodes 802 of length $L_e=\lambda/4$ and of height $h_1$ of a first metal (e.g., an ohmic metal, such as Al) and height $h_2$ of a second metal (e.g., an adhesion metal, such as TiN). These domains also include a top dielectric layer 804 having a height $d_0$, an underlying piezoelectric layer 801 having a height $d_1$, a bottom electrode layer 803 having a height $d_2$, and a bottom dielectric layer 805 having a height $d_3$.

As seen in FIG. 8D, the bus domain includes busses 806 of length $L_b=\lambda/2-2\in$ (where $\in$ is the spacing between the two busses and the half the spacing between the buss and the free edge of the microresonator) and of height $h_3$ of a first metal (e.g., an ohmic metal, such as Al) and height $h_2$ of a second metal (e.g., an adhesion metal, such as TiN). The bus domain also includes an underlying piezoelectric layer 801 having a height $d_1$, a bottom electrode layer 803 having a height $d_2$, and a bottom dielectric layer 805 having a height $d_3$.

Figure 9:
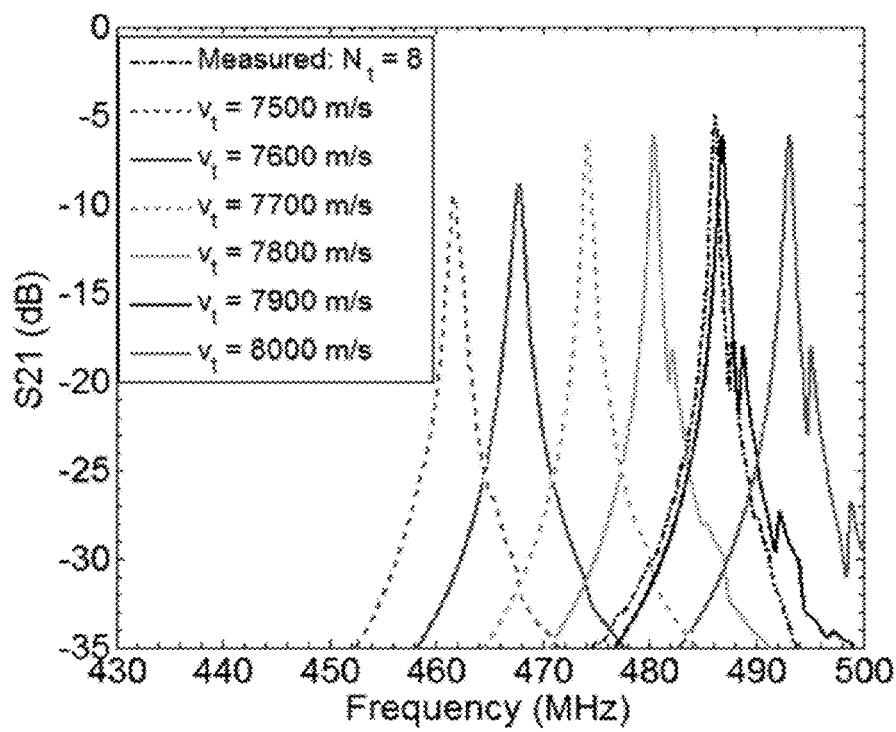
FIG. 9 shows spurious mode suppression as simulated using 2D COM. Provided is the simulated S21 response with $N_t=8$ fingers. Decreasing the acoustic velocity $v_t$ in the transducer domain suppressed the spurious modes.

The admittances were computed for each transducer velocity to determine when the spurious modes were fully suppressed. FIG. 9 demonstrates the effectiveness of this approach. By decreasing the acoustic velocity in the transducer to 7700 m/s, both spurious modes were suppressed, corresponding to a silicon dioxide thickness of about 0.7 μm. In contrast, artificially increasing the transducer velocity, achieved by reducing the finger thickness in the transducer domain, enhanced the spurious modes. In practice, this would increase the motional resistance and degrade the Q. In some circumstances, the free space velocity is higher than velocity in the buss and transducer: $v_t<v_b<v_f$.

Figure 10:
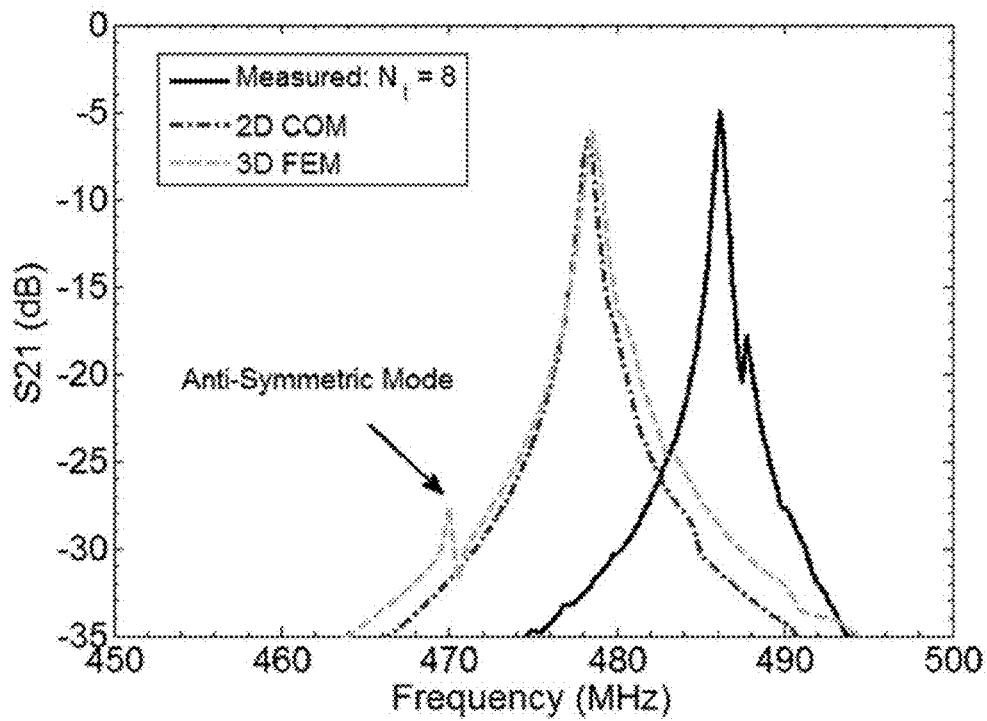
FIG. 10 shows spurious mode suppression for a model and a microresonator including a dielectric layer. In the model and the actual microresonator device, the top dielectric layer (a silicon dioxide layer) was 0.7 μm thick on the transducer, and the bottom dielectric layer (the temperature compensation layer) was reduced to a thickness of 0.8 μm. Provided are the experimental S21 responses (black solid line), as well as simulated S21 responses using either 2D COM analysis (black dashed line) or 3D FEM analysis (gray dashed line).

When $v_t<7700$ m/s, the spurious modes were fully suppressed with a noticeable decrease in S21, which is caused from an impedance mismatch. This suggests an optimal thickness exists to reduce acoustic loss while suppressing spurious modes. In FIG. 10, a 3D FEM simulation was performed to compare with the 2D COM simulation when 0.7 μm of silicon dioxide was deposited in the transducer region. To maintain temperature compensation, the bottom oxide layer was reduced from 1.5 μm to 0.8 μm. Because the top and bottom oxide layers alter the dispersion behavior of the microresonator, special care is required to suppress both anti-symmetric (see, e.g., Branch D W et al., *IEEE Trans. Ultrason. Ferroelectr. Frequency Control* 2014; 61(5):729-38) and fine-frequency modes, while maintaining temperature compensation. In FIG. 10, a small anti-symmetric mode appears from changing the bottom oxide thickness and the Q was slightly degraded. There is clearly a trade-off between maintaining high Q and adequately suppressing the spurious modes (i.e., fine-frequency modes) using the silicon dioxide deposition method.

The 2D COM method was significantly faster than the 3D FEM, requiring 0.75 second/frequency point compared to 5 minutes/frequency point. The merits of the 2D COM method include, e.g., the ability to sweep through larger parameter spaces to identify the locations of spurious modes and implement strategies for their suppression. Though narrow frequency sweeps using the 3D FEM reduce computational time, the exact position of the resonance is not always known. This requires coarser sweeps that may under estimate the impact of smaller spurious modes appearing near the fundamental resonance.

Conclusion

Transverse wave propagation along the acoustic aperture gives rise to fine-frequency modes that appear near the fundamental resonance. The source of these modes is attributed to transverse modes leaking acoustic energy which propagates in the bussing. Since the acoustic velocity of the transducer is often lower due to the thicker metallized bussing, additional dielectric layers (e.g., silicon dioxide) are suitable for decreasing the velocity in the transducer domain.

The 2D COM method described herein is an approximate technique to study the origin of fine-frequency modes and to investigate methods for their suppression. The addition of silicon dioxide eliminated the spurious modes, in which an optimal thickness is determined to minimize acoustic loss.

The details provided herein exemplify a useful method to model microresonators in order to suppress spurious modes, while maximizing quality factor Q and/or minimizing impedance mismatch (e.g., as determined by maximizing the S21 response). The model provides useful structural modifications that can be employed for fine-frequency mode suppression, e.g., inclusion of a top dielectric layer having a particular thickness that minimized spurious modes near the resonant frequency without imposing an impedance mismatch. Other structural components, e.g., electrode finger dimensions, buss dimensions, free space dimensions, dielectric layers in any useful domain (e.g., transducer, buss, free space, and/or stub domains) may be modified accordingly to parameters afforded by the exemplary model described herein.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method of suppressing one or more spurious modes in a microresonator, the method comprising:
   providing a coupling-of-modes model of the microresonator, wherein the model comprises a forward acoustic wave and a backward acoustic wave that characterizes the microresonator;
   adjusting an acoustic velocity in a transducer domain of the model to provide a minimized spurious response, wherein the transducer domain in the model comprises one or more electrodes;
   determining a thickness of a first dielectric layer that corresponds to the acoustic velocity of the minimized spurious response; and
   depositing the first dielectric layer on a top surface of the microresonator, wherein the first dielectric layer comprises the thickness from the determining step and the top surface comprises one or more electrodes.

2. The method of claim 1, wherein the providing step comprises providing a two-dimensional coupling-of-modes model.

3. The method of claim 1, wherein the model further comprises a detuning parameter δ for each domain of the model.

4. The method of claim 3, wherein the model comprises a detuning parameter $δ_t$ for a transducer domain of the model, a detuning parameter $δ_b$ for a buss domain of the model, a detuning parameter $δ_f$ for a free space domain of the model, and/or a detuning parameter $δ_s$ for a stub domain of the model.

5. The method of claim 4, wherein each detuning parameter for each domain is associated with an acoustic velocity in each domain.

6. The method of claim 4, wherein the adjusting step comprises increasing or decreasing an acoustic velocity $v_t$ in the transducer domain.

7. The method of claim 6, wherein the adjusting step comprises an acoustic velocity $v_t$ in the transducer domain that is less than an acoustic velocity $v_b$ in the buss domain and/or less than an acoustic velocity $v_f$ in the free space domain.

8. The method of claim 7, wherein $v_t$ is less $v_b$, which in turn is less than $v_f$.

9. The method of claim 1, wherein the adjusting step comprises decreasing an acoustic velocity.

10. The method of claim 9, wherein the adjusting step further comprises determining a transmission measurement of the model.

11. The method of claim 1, wherein the determining step comprises a transfer matrix method, an iterative method, a finite element method, a finite difference method, or a finite volume method.

12. The method of claim 11, wherein the depositing step comprises depositing the first dielectric layer on a top surface of the one or more electrodes of the microresonator.

13. The method of claim 1, wherein the thickness of the first dielectric layer is of from about 0.5 μm to about 1 μm.

14. The method of claim 1, wherein the one or more spurious modes comprises one or more fine-frequency modes.

15. The method of claim 14, wherein the one or more fine-frequency modes has a center frequency of from about 450 MHz to about 500 MHz.

16. The method of claim 1, wherein the microresonator comprises:
a piezoelectric layer comprising a top surface and a bottom surface; and
a top electrode layer disposed on the top surface of the piezoelectric layer, wherein the top electrode layer comprises an input electrode and an output electrode.

17. The method of claim 16, wherein the input electrode comprises:
a first interconnect buss;
a first plurality of fingers that extend orthogonally from the first interconnect buss, each finger in the first plurality of fingers having a first length; and
a first plurality of stubs that extend orthogonally from the first interconnect buss, each stub in the first plurality of stubs having a second length, the second length being less than the first length.

18. The method of claim 17, wherein the output electrode comprises:
a second interconnect buss in parallel with the first interconnect buss, wherein the first plurality of fingers extend from the first interconnect buss towards the second interconnect buss;
a second plurality of fingers that extend orthogonally from the second interconnect buss towards the first interconnect buss, each finger in the second plurality of fingers having the first length; and
a second plurality of stubs that extend orthogonally from the second interconnect buss towards the first interconnect buss, each stub in the second plurality of stubs having the second length.

19. The method of claim 16, wherein the microresonator further comprises:
the first dielectric layer disposed on a top surface of the top electrode layer.

20. The method of claim 16, wherein the microresonator further comprises:
a bottom electrode layer disposed on the bottom surface of the piezoelectric layer.

21. The method of claim 20, wherein the microresonator further comprises:
a second dielectric layer disposed on a bottom surface of the bottom electrode layer.

22. The method of claim 1, wherein the microresonator comprises a size of less than 500 μm in length, 150 μm in width, and/or 10 μm in thickness.

23. A method of suppressing one or more spurious modes in a microresonator, the method comprising:
providing the microresonator comprising a piezoelectric layer comprising a top surface and a bottom surface; and a top electrode layer disposed on the top surface of the piezoelectric layer, wherein the top electrode layer comprises an input electrode and an output electrode;
providing a coupling-of-modes model of the microresonator, wherein the model comprises a forward acoustic wave and a backward acoustic wave that characterizes the microresonator;
adjusting an acoustic velocity in a transducer domain of the model to provide a minimized spurious response, wherein the transducer domain in the model comprises one or more electrodes;
determining a thickness of a first dielectric layer that corresponds to the acoustic velocity of the minimized spurious response; and
depositing the first dielectric layer on the top surface of the piezoelectric layer of the microresonator, wherein the first dielectric layer comprises the thickness from the determining step.

* * * * *